United States Patent
Adkisson et al.

(10) Patent No.: US 8,034,699 B2
(45) Date of Patent: Oct. 11, 2011

(54) ISOLATION WITH OFFSET DEEP WELL IMPLANTS

(75) Inventors: James W. Adkisson, Jericho, VT (US); Andres Bryant, Burlington, VT (US); Mark D. Jaffe, Shelburne, VT (US); Alain Loiseau, Meylan (FR)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/464,206

(22) Filed: May 12, 2009

(65) Prior Publication Data
US 2010/0289082 A1 Nov. 18, 2010

(51) Int. Cl.
*H01L 21/425* (2006.01)
(52) U.S. Cl. .................. 438/527; 257/368
(58) Field of Classification Search .......... 257/368, 257/262, E29.255–E29.313; 438/135, 142, 438/527, 299, 199
See application file for complete search history.

(56) References Cited

U.S. PATENT DOCUMENTS

| | | | |
|---|---|---|---|
| 5,868,870 A | 2/1999 | Fazan et al. | |
| 6,207,532 B1 | 3/2001 | Lin et al. | |
| 6,459,141 B2 | 10/2002 | Yu et al. | |
| 6,500,705 B2 * | 12/2002 | Kumagai | 438/223 |
| 6,806,147 B1 | 10/2004 | Yu et al. | |
| 6,815,317 B2 | 11/2004 | Schafbauer et al. | |
| 6,876,055 B2 | 4/2005 | Iwata et al. | |
| 6,927,463 B2 | 8/2005 | Iwata et al. | |

* cited by examiner

*Primary Examiner* — Ha Tran T Nguyen
*Assistant Examiner* — Shaun Campbell
(74) *Attorney, Agent, or Firm* — Gibb I.P. Law Firm, LLC; Richard M. Kotulak, Esq.

(57) ABSTRACT

A method implants impurities into well regions of transistors. The method prepares a first mask over a substrate and performs a first shallow well implant through the first mask to implant first-type impurities to a first depth of the substrate. The first mask is removed and a second mask is prepared over the substrate. The method performs a second shallow well implant through the second mask to implant second-type impurities to the first depth of the substrate and then removes the second mask. A third mask is prepared over the substrate. The third mask has openings smaller than openings in the first mask and the second mask. A first deep well implant is performed through the third mask to implant the first-type impurities to a second depth of the substrate, the second depth of the substrate being greater than the first depth of the substrate. The third mask is removed and a fourth mask is prepared over the substrate, the fourth mask has openings smaller than the openings in the first mask and the second mask. Then, a second deep well implant is performed through the fourth mask to implant the second-type impurities to the second depth of the substrate.

15 Claims, 4 Drawing Sheets

ISOLATION WITH OFFSET DEEP WELL IMPLANTS

BACKGROUND

1. Field of the Invention

The embodiments of the invention generally relate to semiconductor transistors and more particularly relate to a dual mask method that forms a shallow well region and a deep well region within transistors, and the resulting structure.

2. Description of the Related Art

Complimentary metal oxide semiconductor (CMOS) transistors utilize transistors that have opposite characteristics depending upon the dopants used. These opposite type transistors are commonly referred to as positive-type (P-type) and negative-type (N-type) transistors.

One issue that exists with such transistors as they are scaled (reduced in size) relates to the spacing between the P-type and N-type transistors. More specifically, as the transistors becomes smaller and smaller, it becomes more difficult to separate the well regions of the different types of transistors. The embodiments described below address this situation using a new methodology that produces a new structure.

SUMMARY

The embodiments herein utilize a method for forming transistors that begins by preparing a first mask over a substrate. The substrate has a top surface and the first mask has first openings. The method performs a first shallow well implant through the first openings of the first mask to implant first-type impurities to a first depth of the substrate below the top surface of the substrate. Then the first mask is removed or altered.

The method then prepares a second mask over the substrate or uses the altered first mask. The second mask has second openings and the method performs a second shallow well implant through the second openings of the second mask to implant second-type impurities to the first depth of the substrate. Then, the second mask or altered first mask is removed or altered.

The method then prepares a third mask over the substrate or uses the altered third mask. The third mask has third openings that are smaller than the first openings and the second openings. The third openings are aligned with locations where the first openings were positioned on the substrate. The method then performs a first deep well implant through the third openings of the third mask to implant the first-type impurities to a second depth of the substrate below (relative to the top surface of the substrate) the top surface of the substrate. The second depth of the substrate is at least five times greater (at least five times deeper below the top surface of the substrate) than the first depth of the substrate. The first deep well implant is centered below (relative to the top surface of the substrate) the first shallow well implant. Then the third mask is removed.

Next, the method prepares a fourth mask over the substrate. The fourth mask has fourth openings smaller than the second openings. The fourth openings are aligned with locations where the second openings were positioned on the substrate. The method performs a second deep well implant through the fourth mask to implant the second-type impurities to the second depth of the substrate. The second deep well implant is centered below (relative to the top surface of the substrate) the second shallow well implant.

The first and second masks are thinner than the third and fourth masks. Also, the first mask and the second mask have openings that are spaced closer together when compared to openings in the third mask and the fourth mask. This allows the first shallow well implants to contact the second shallow well implants in the substrate, but prevents the first deep well implants from contacting the second deep well implants in the substrate. Therefore, the first deep well implants are spaced apart (offset from) the second deep well implants. Also, the differences in the sizes of the openings between that the first and second masks and the third and fourth masks cause the first shallow well implants and the second shallow well implants to be implanted into a wider area of the substrate than the first deep well implants and the second deep well implants. The fourth mask, or altered third mask is then removed.

Then, the process completes the transistor by forming a gate oxide on the top surface of the substrate and forming gate conductors on the gate oxide. The gate conductors are centered above (relative to the top surface of the substrate) the first deep well implant and the second deep well implant. Source and drain regions are formed within the substrate adjacent the gate conductors. The first deep well implants, the first shallow well implants, the gate oxide, ones of the gate conductors, and ones of the source and drain regions form first-type transistors. Similarly, the second deep well implants, the second shallow well implants, the gate oxide, other ones of the gate conductors, and other ones of the source and drain regions form second-type transistors.

The foregoing process produces a new semiconductor structure that comprises at least one first transistor and second transistor formed within and on the top surface of a substrate. Shallow trench isolation regions are between the first transistor and the second transistor.

The first transistor has a first gate oxide on the top surface of the substrate and a first gate conductor on the first gate oxide. First source and drain regions are within the substrate adjacent the first gate conductor. A first shallow well implant is within the substrate below (relative to the top surface of the substrate) the first gate conductors and the first source and drain regions. Further, a first deep well implant is within the substrate below (relative to the top surface of the substrate) the first shallow well implant. The first deep well implant is at least five times deeper (relative to the top surface of the substrate) than the first shallow well implant. The first deep well implant is centered below (relative to the top surface of the substrate) the first shallow well implant.

Similarly, the second transistor has a second gate oxide on the top surface of the substrate and a second gate conductor on the second gate oxide. Second source and drain regions are within the substrate adjacent the second gate conductor. A second shallow well implant is within the substrate below (relative to the top surface of the substrate) the second gate conductors and the second source and drain regions. Further, a second deep well implant is within the substrate below (relative to the top surface of the substrate) the second shallow well implant. The second deep well implant is at least five times deeper (relative to the top surface of the substrate) than the second shallow well implant. The second deep well implant is centered below (relative to the top surface of the substrate) the second shallow well implant.

The first shallow well implant contacts the second shallow well implant in the substrate; however, the first deep well implant is spaced apart from the second deep well implant in the substrate. Further, the first shallow well implant has a width (relative to the top surface of the substrate) greater than the width of the first deep well implant. Similarly, the second shallow well implant has a width (relative to the top surface of the substrate) greater than the width of the second deep well implant.

The first shallow well implant and the first deep well implant comprise a first-type impurity, while the second shallow well implant and the second deep well implant comprise a second-type impurity. The first-type impurity comprises any positive-type impurity (P-type impurity) and the second-type impurity comprises any negative-type impurity (N-type impurity).

BRIEF DESCRIPTION OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, as transistors become smaller and smaller, it becomes more difficult to separate the well regions of the different types of transistors. This can result in a number of concerns. For example, the dopants within the well regions can sometimes migrate into the source and drain regions, which can cause high capacitance and/or junction leakage and can also cause issues such as latching, poor noise immunity, lateral straggle, etc. Such issues are amplified for transistors that include very deep channel regions which provide good latchup immunity, where misalignment and critical dimension control are important.

In order to address such issues, the present embodiments use two masks per well. The shallow well implants are done with a first mask and a second mask with smaller dimensions is used for the deep well implants. The shallow implants can be done with thinner photoresist. Therefore, the first mask can be made substantially thinner than the second mask. By using a thinner mask, tighter tolerances can be achieved and less scattering will occur during the shallow well implant. Further, with embodiments herein, the deep implants are spaced away from each other which reduces leakage and allows for better defined shallow well junctions.

Figure 1:
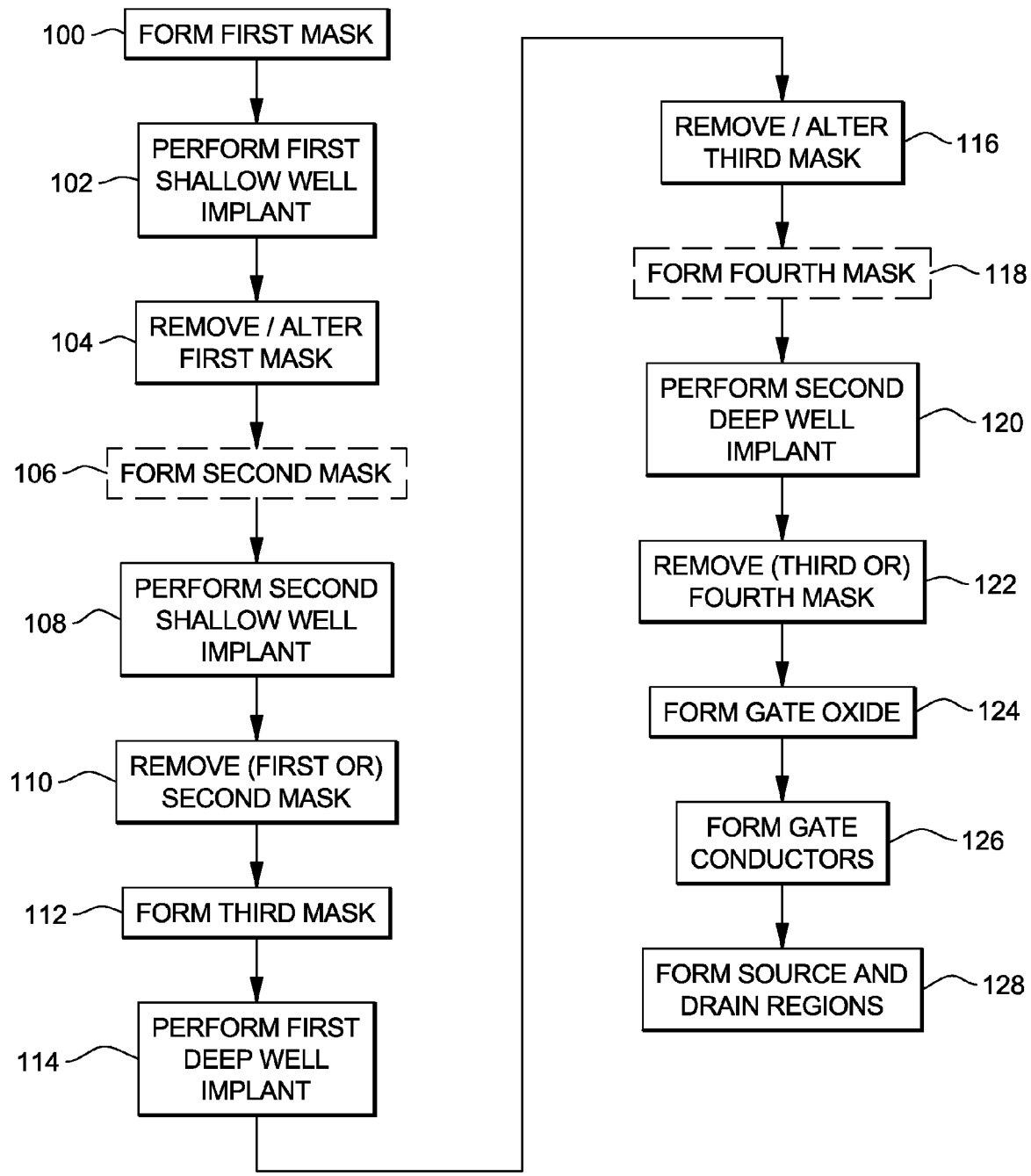
FIG. 1 is a flowchart illustrating method embodiments herein.

As shown in flowchart form in FIG. 1, the embodiments herein utilize a method for forming transistors that begins by preparing (patterning) a first mask over a substrate (item 100). The substrate can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. Similarly, the masks mentioned herein can comprise any commonly known masks, such as organic photoresists that are exposed to a pattern of light and developed to allow openings to form in the mask.

The substrate has a top surface and the first mask has first openings. In item 102, the method performs a first shallow well implant through the first openings of the first mask to implant first-type impurities to a first depth of the substrate below the top surface of the substrate. The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques.

Figure 2:
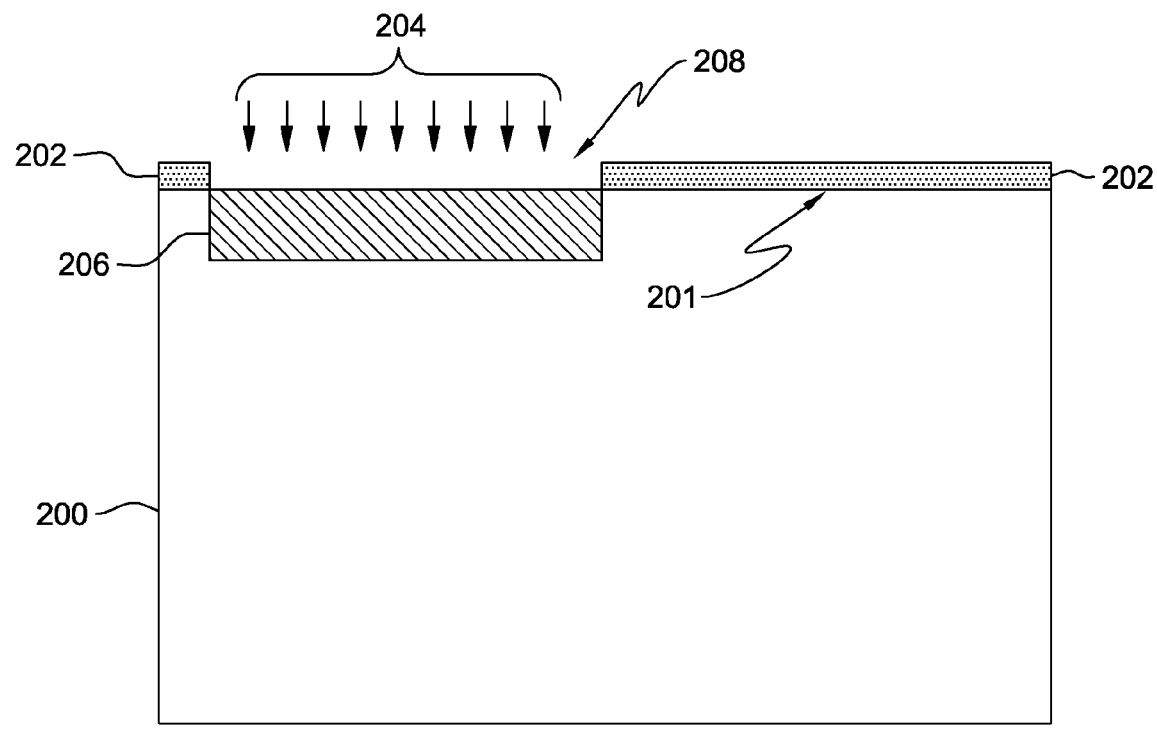
FIG. 2 is a schematic process and sectional drawing of an integrated circuit structure according to embodiments herein.

This is also shown in schematic form (in cross-section) in FIG. 2. Item 200 represents the substrate and item 202 represents the first mask. As shown in FIG. 2, impurities are implanted 204 through the first opening 208 to create the first shallow well implant 206. After this process, the first mask is removed or altered as discussed below in item 104.

The method then prepares a second mask over the substrate in item 106 or uses the altered first mask. The second mask has second openings and the method performs a second shallow well implant through the second openings of the second mask (item 108) to implant second-type impurities to the first depth of the substrate.

Figure 3:
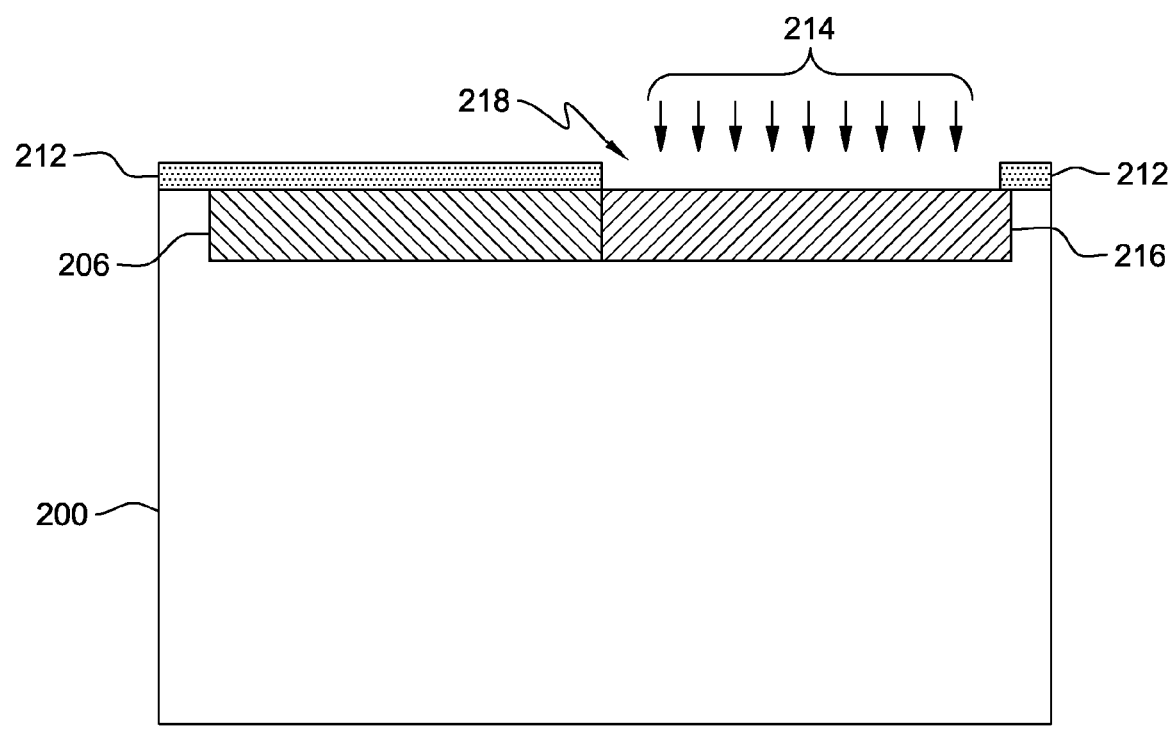
FIG. 3 is a schematic process and sectional drawing of an integrated circuit structure according to embodiments herein.

As shown in FIG. 3, the second mask is represented by item 212 and impurities are implanted 214 for the second opening 218 to create the second shallow well implant 216. As mentioned above, the first shallow well implant 206 has opposite doping polarity with respect to the second shallow well implant 216. Therefore, opposite hashings are shown in the drawings to distinguish these different implants. After this process, the second mask (or altered first mask) is removed in item 110.

The method then prepares a third mask over the substrate in item 112. The third mask has third openings 228 that are smaller than the first openings 208 and the second openings 218. The third openings 228 are aligned with locations where the first openings 208 were positioned on the substrate.

Figure 4:
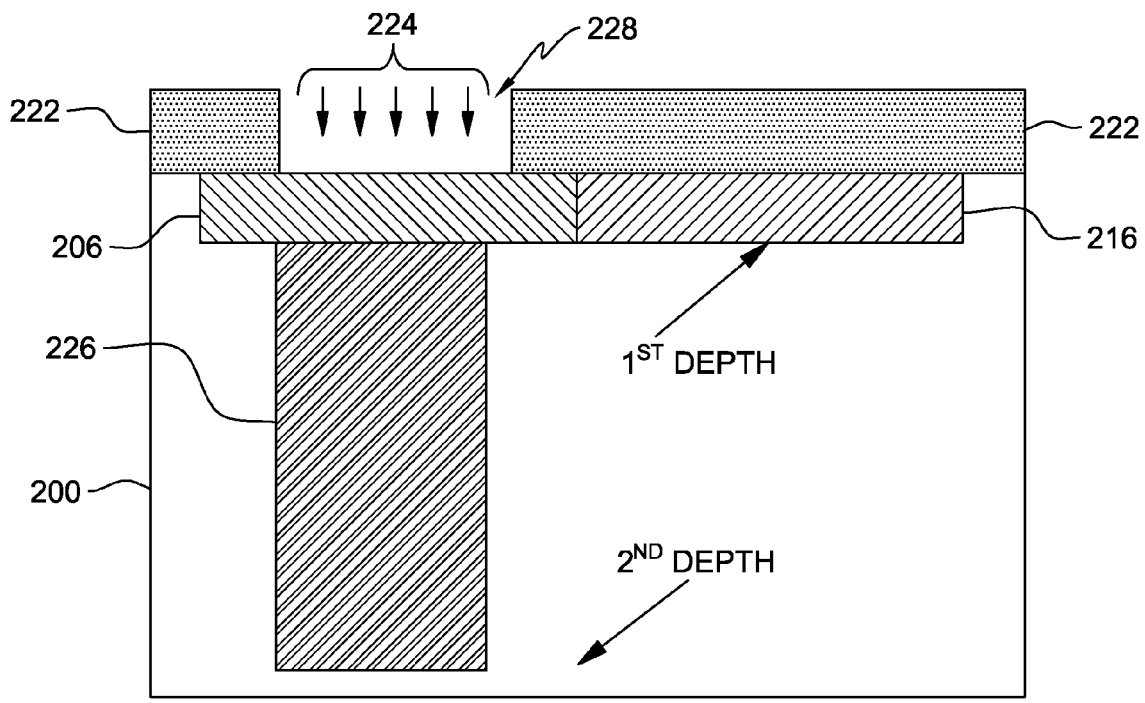
FIG. 4 is a schematic process and sectional drawing of an integrated circuit structure according to embodiments herein.

As shown in item 114 and in FIG. 4, the method then performs a first deep well implant 224 through the third openings 228 of the third mask 222 to implant the first-type impurities 226 to a second depth of the substrate 200 below (relative to the top surface of the substrate) the top surface of the substrate 200. The second depth of the substrate is at least five times greater (at least five times deeper below the top surface of the substrate) than the first depth of the substrate and could be 10 times, 15 times, etc. deeper than the first depth. For example, the first depth could be 20 nm, 30 nm, 40 nm, etc. and the second that could be 600 nm, 700 nm, 800 nm, etc. Note that these measures are only examples and that the embodiments herein are not limited to these specific dimensions but instead are applicable to all appropriate scaling dimensions.

The first deep well implant 226 is centered below (relative to the top surface of the substrate) the first shallow well implant 206. The third mask is removed or altered as discussed below in item 116.

Figure 5:
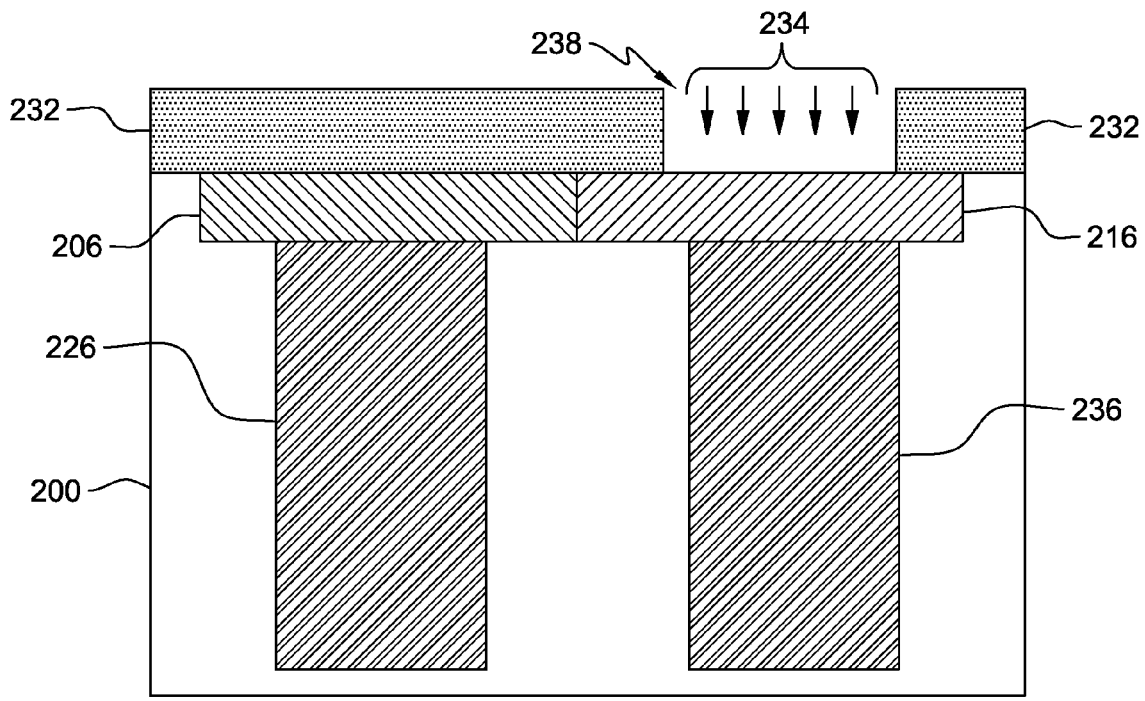
FIG. 5 is a schematic process and sectional drawing of an integrated circuit structure according to embodiments herein.

Next, the method prepares a fourth mask over the substrate in item 118 or uses the altered third mask. As shown in FIG. 5, the fourth mask 232 has fourth openings 238 smaller than the second openings 218. The fourth openings 238 are aligned with locations where the second openings 218 were positioned on the substrate 200. The method performs a second deep well implant 234 through the fourth mask 232 in item 120 to implant the second-type impurities 236 to the second depth of the substrate. The second deep well implant 236 is centered below (relative to the top surface of the substrate) the second shallow well implant 216. Then the third mask is removed in item 122.

In addition, as shown in the drawings, the first and second masks (202, 212) are thinner than the third and fourth masks (222, 232). Also, the first mask 202 and the second mask 212 have openings (208, 218) that are spaced closer together when compared to openings (228, 238) in the third mask 222 and the fourth mask 232. This allows the first shallow well implants 206 to contact the second shallow well implants 216 in the substrate, but prevents the first deep well implants 226 from contacting the second deep well implants 236 in the substrate. Therefore, the first deep well implants are spaced apart (offset from) the second deep well implants. Also, the differences in the sizes of the openings between the first and second masks and the third and fourth masks cause the first shallow well implants and the second shallow well implants to be implanted into a wider area of the substrate than the first deep well implants and the second deep well implants.

Figure 6:
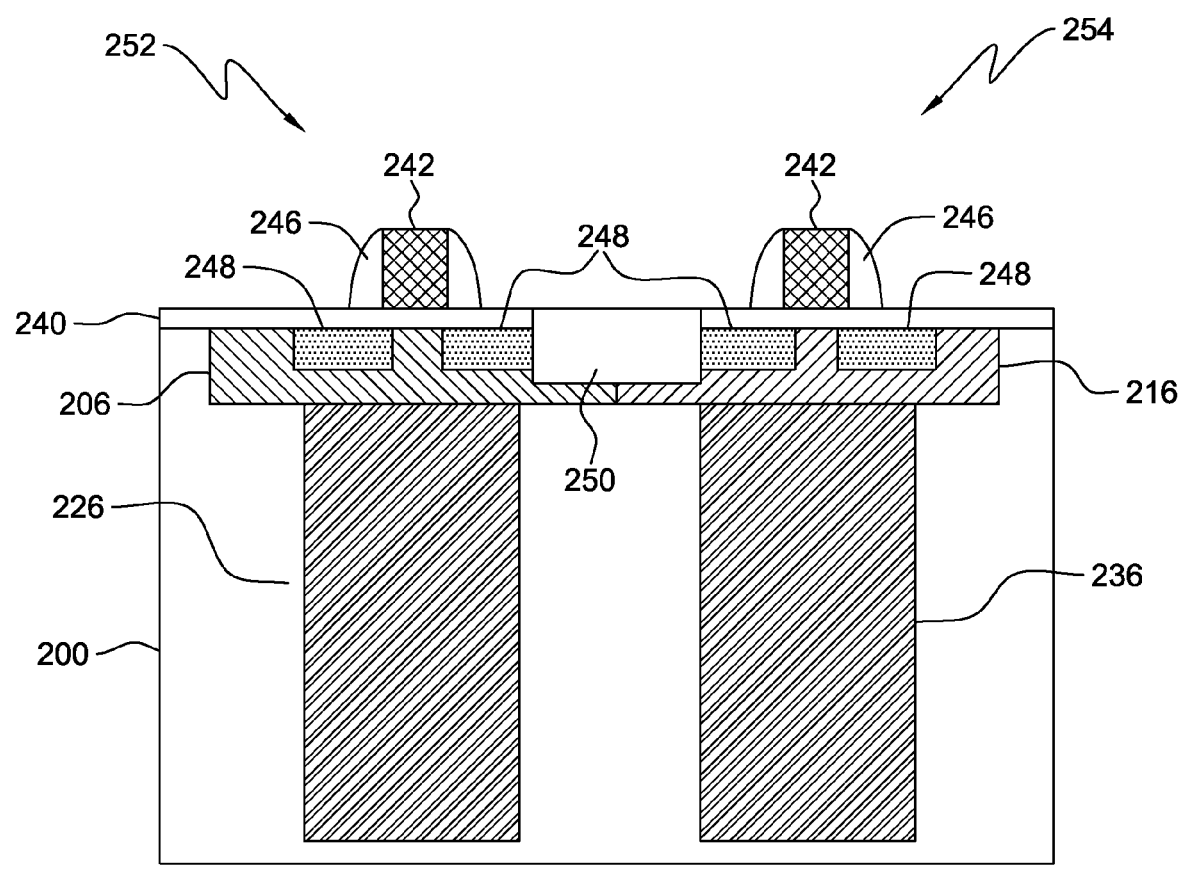
FIG. 6 is a schematic process and sectional drawing of an integrated circuit structure according to embodiments herein.

As shown in FIGS. 1 and 6, the process completes the transistor by forming (growing) a gate oxide 240 on the top surface of the substrate (item 124) and forming gate conductors (polysilicon, metals, metal alloys, or any other conductor) 242 on the gate oxide (item 126). The gate conductors 242 are centered above (relative to the top surface of the substrate) the first deep well implant 226 and the second deep well implant 236.

If needed, sidewall spacers 246 (e.g., nitrides, oxides, etc.) can be formed on the gate conductors 242. In item 128, source and drain regions 248 are formed within the substrate adjacent the gate conductors 242.

The first deep well implants 226, the first shallow well implants 206, the gate oxide 240, ones of the gate conductors 242, and ones of the source and drain regions 248 form first-type transistors. Similarly, the second deep well implants 236, the second shallow well implants 216, the gate oxide 240, other ones of the gate conductors 242, and other ones of the source and drain regions 248 form second-type transistors.

The foregoing process produces a new semiconductor structure that comprises at least one first transistor 252 and at least one second transistor 254 formed within and on the top surface of a substrate. Those ordinarily skilled in the art would understand that many of such transistor pairs are formed simultaneously, and that only two are shown to simplify the drawings and ease understanding of the invention. Shallow trench isolation regions are between the first transistor and the second transistor. In addition to the methods discussed herein, any other methodology can be utilized to form the various transistors mentioned here, such as those discussed in U.S. Pat. No. 7,491,598 (incorporated herein by reference).

The first transistor has a first gate oxide on the top surface 201 of the substrate 200 and a first gate conductor 242 on the first gate oxide 204. First source and drain regions 248 are within the substrate 200 adjacent the first gate conductor 242. A first shallow well implant 206 is within the substrate below (relative to the top surface of the substrate) the first gate conductor 242 and the first source and drain regions 248. Further, a first deep well implant 226 is within the substrate below (relative to the top surface of the substrate) the first shallow well implant 206. The first deep well implant 226 is at least 5 times, 10 times, 15 times, etc., deeper (relative to the top surface of the substrate) than the first shallow well implant 206. The first deep well implant 226 is centered below (relative to the top surface of the substrate) the first shallow well implant 206.

Similarly, the second transistor 254 has a second gate oxide 240 on the top surface 201 of the substrate 200 and a second gate conductor 242 on the second gate oxide 240. Second source and drain regions 248 are within the substrate 200 adjacent the second gate conductor 242. A second shallow well implant 216 is within the substrate below (relative to the top surface of the substrate) the second gate conductor 242 and the second source and drain regions 248. Further, a second deep well implant 236 is within the substrate below (relative to the top surface of the substrate) the second shallow well implant 216. The second deep well implant 236 is at least 5 times, 10 times, 15 times, etc., deeper (relative to the top surface of the substrate) than the second shallow well implant 216. The second deep well implant 236 is centered below (relative to the top surface of the substrate) the second shallow well implant 216.

The first shallow well implant 206 contacts the second shallow well implant 216 in the substrate; however, the first deep well implant 226 is spaced apart from the second deep well implant 236 in the substrate. Further, the first shallow well implant 206 has a width (relative to the top surface of the substrate) greater than the width of the first deep well implant 226. Similarly, the second shallow well implant 216 has a width (relative to the top surface of the substrate) greater than the width of the second deep well implant 236.

The first shallow well implant 206 and the first deep well implant 226 comprise a first-type impurity, while the second shallow well implant 216 and the second deep well implant 236 comprise a second-type impurity. The first-type impurity comprises any positive-type impurity (P-type impurity, e.g., phosphorus, arsenic, antimony, etc.) and the second-type impurity comprises any negative-type impurity (N-type impurity, e.g., boron, indium, etc.).

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for implanting impurities into well regions of transistors, said method comprising:
    preparing a first mask over a substrate;
    performing a first shallow well implant through said first mask to implant first-type impurities to a first depth of said substrate;
    preparing a second mask over said substrate;
    performing a second shallow well implant through said second mask to implant second-type impurities to said first depth of said substrate;
    preparing a third mask over said substrate, said third mask having openings smaller than openings in said first mask and said second mask;
    performing a first deep well implant through said third mask to implant said first-type impurities to a second depth of said substrate, said second depth of said substrate being greater than said first depth of said substrate, and said first deep well implant being centered below, relative to said top surface of said substrate, said first shallow well implant;
    preparing a fourth mask over said substrate, said fourth mask having openings smaller than said openings in said first mask and said second mask; and
    performing a second deep well implant through said fourth mask to implant said second-type impurities to said second depth of said substrate, said second deep well implant being centered below, relative to said top surface of said substrate, said second shallow well implant.

2. The method according to claim 1, said first mask and said second mask being thinner than said third mask and said fourth mask.

3. The method according to claim 1, said first mask and said second mask having openings that are spaced closer together when compared to openings in said third mask and said fourth mask.

4. The method according to claim 1, said first shallow well implants contacting said second shallow well implants in said substrate, and said first deep well implants being spaced apart from said second deep well implants in said substrate.

5. The method according to claim 1, said first shallow well implants and said second shallow well implants being implanted into a wider area of said substrate than said first deep well implants and said second deep well implants.

6. A method for implanting impurities into well regions of transistors, said method comprising:
    preparing a first mask over a substrate, said first mask having first openings;
    performing a first shallow well implant through said first openings of said first mask to implant first-type impurities to a first depth of said substrate;
    preparing a second mask over said substrate, said second mask having second openings;
    performing a second shallow well implant through said second openings of said second mask to implant second-type impurities to said first depth of said substrate;
    preparing a third mask over said substrate, said third mask having third openings smaller than said first openings and said second openings, and said third openings being aligned with locations where said first openings were positioned on said substrate;
    performing a first deep well implant through said third openings of said third mask to implant said first-type impurities to a second depth of said substrate, said second depth of said substrate being at least five times greater than said first depth of said substrate, and said first deep well implant being centered below, relative to said top surface of said substrate, said first shallow well implant;
    preparing a fourth mask over said substrate, said fourth mask having fourth openings smaller than said second openings, and said fourth openings being aligned with locations where said second openings were positioned on said substrate; and
    performing a second deep well implant through said fourth mask to implant said second-type impurities to said second depth of said substrate, said second deep well implant being centered below, relative to said top surface of said substrate, said second shallow well implant.

7. The method according to claim 6, said first mask and said second mask being thinner than said third mask and said fourth mask.

8. The method according to claim 6, said first mask and said second mask having openings that are spaced closer together when compared to openings in said third mask and said fourth mask.

9. The method according to claim 6, said first shallow well implants contacting said second shallow well implants in said substrate, and said first deep well implants being spaced apart from said second deep well implants in said substrate.

10. The method according to claim 6, said first shallow well implants and said second shallow well implants being implanted into a wider area of said substrate than said first deep well implants and said second deep well implants.

11. A method for forming transistors, said method comprising:
    preparing a first mask over a substrate, said substrate having a top surface, and said first mask having first openings;
    performing a first shallow well implant through said first openings of said first mask to implant first-type impurities to a first depth of said substrate below said top surface of said substrate;
    preparing a second mask over said substrate, said second mask having second openings;
    performing a second shallow well implant through said second openings of said second mask to implant second-type impurities to said first depth of said substrate;
    preparing a third mask over said substrate, said third mask having third openings smaller than said first openings and said second openings, and said third openings being aligned with locations where said first openings were positioned on said substrate;
    performing a first deep well implant through said third openings of said third mask to implant said first-type impurities to a second depth of said substrate below said top surface of said substrate, said second depth of said substrate being at least five times greater than said first depth of said substrate, and said first deep well implant being centered below, relative to said top surface of said substrate, said first shallow well implant;

preparing a fourth mask over said substrate, said fourth mask having fourth openings smaller than said second openings, and said fourth openings being aligned with locations where said second openings were positioned on said substrate;

performing a second deep well implant through said fourth mask to implant said second-type impurities to said second depth of said substrate, said second deep well implant being centered below, relative to said top surface of said substrate, said second shallow well implant;

forming a gate oxide on said top surface of said substrate;

forming gate conductors on said gate oxide, said gate conductors being centered above, relative to said top surface of said substrate, said first deep well implant and said second deep well implant; and forming source and drain regions within said substrate adjacent said gate conductors, said first deep well implants, said first shallow well implants, said gate oxide ones of said gate conductors, and ones of said source and drain regions forming first-type transistors, and said second deep well implants, said second shallow well implants, said gate oxide ones of said gate conductors, and ones of said source and drain regions forming second-type transistors.

12. The method according to claim 11, said first mask and said second mask being thinner than said third mask and said fourth mask.

13. The method according to claim 11, said first mask and said second mask having openings that are spaced closer together when compared to openings in said third mask and said fourth mask.

14. The method according to claim 11, said first shallow well implants contacting said second shallow well implants in said substrate, and said first deep well implants being spaced apart from said second deep well implants in said substrate.

15. The method according to claim 11, said first shallow well implants and said second shallow well implants being implanted into a wider area of said substrate than said first deep well implants and said second deep well implants.

* * * * *